(12) United States Patent
Hagihara et al.

(10) Patent No.: US 11,614,814 B2
(45) Date of Patent: Mar. 28, 2023

(54) TOUCH PANEL

(71) Applicant: Fujitsu Component Limited, Tokyo (JP)

(72) Inventors: Hideyuki Hagihara, Tokyo (JP); Yutaka Ueno, Tokyo (JP); Masaya Morohashi, Tokyo (JP); Takuya Ozawa, Tokyo (JP); Yuta Nakamura, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 17/304,165

(22) Filed: Jun. 15, 2021

(65) Prior Publication Data

US 2021/0397277 A1 Dec. 23, 2021

(30) Foreign Application Priority Data

Jun. 19, 2020 (JP) .............................. JP2020-106220

(51) Int. Cl.
*G06F 3/041* (2006.01)

(52) U.S. Cl.
CPC .... *G06F 3/041* (2013.01); *G06F 2203/04107* (2013.01)

(58) Field of Classification Search
CPC ......... G06F 3/041–0412; G06F 1/1607; G06F 1/1637; G06F 1/1643; G06F 1/16–1698; G06F 1/1658; G06F 1/1616; G06F 1/1601; G06F 1/1656; G06F 3/045
See application file for complete search history.

(56) References Cited

U.S. PATENT DOCUMENTS

| | | | | |
|---|---|---|---|---|
| 2009/0296341 A1* | 12/2009 | Eldershaw | .............. | G06F 3/016 361/679.43 |
| 2012/0098779 A1* | 4/2012 | Nakanishi | ............... | G06F 3/041 345/173 |
| 2014/0209445 A1 | 7/2014 | Iwawaki | | |
| 2015/0021157 A1* | 1/2015 | Tsurusaki | ............... | H03K 17/16 200/600 |
| 2015/0378488 A1 | 12/2015 | Okamura | | |
| 2016/0026303 A1* | 1/2016 | Ueno | ...................... | G06F 3/045 345/173 |
| 2018/0088710 A1* | 3/2018 | Hagihara | ............ | G02F 1/13338 |
| 2020/0028950 A1* | 1/2020 | Mody | ................... | G06F 1/1626 |

FOREIGN PATENT DOCUMENTS

| | | |
|---|---|---|
| JP | 2014-146174 A | 8/2014 |
| JP | 2016-009371 A | 1/2016 |
| JP | 2016-024680 A | 2/2016 |
| JP | 2017-187875 A | 10/2017 |

* cited by examiner

*Primary Examiner* — Sanjiv D. Patel
(74) *Attorney, Agent, or Firm* — Shumaker & Sieffert, P.A.

(57) ABSTRACT

A touch panel comprises: a first electrode substrate having a first conductive film; a second electrode substrate having a decorative portion facing the first conductive film; and a case configured to contain the first electrode substrate, wherein the first electrode substrate has a larger area than the second electrode substrate, and wherein the case is configured to cover an outer peripheral portion of the first electrode substrate outside the second electrode substrate, and not to cover the second electrode substrate.

8 Claims, 10 Drawing Sheets

A-A' SECTION

A-A' SECTION

B-B' SECTION

C-C' SECTION

D-D' SECTION

E-E' SECTION

TOUCH PANEL

This application claims the benefit to Japanese Patent Application No. 2020-106220, filed on Jun. 19, 2020, the entire contents of which are incorporated herein by reference.

TECHNICAL FIELD

The present invention relates to a touch panel.

BACKGROUND

Various touch panels such as a resistive film type, a capacitance type, and an electrostatic coupling type are well known. Some of these touch panels are provided with a decorative portion such as a design print or a design sheet on an operation surface thereof, in order to improve the visual quality of the touch panel.

SUMMARY

In recent years, there is a growing need for a touch panel having a structure in which a decorative portion is provided on an operation surface and a bezel or a front case which covers an outer peripheral portion of an electrode substrate is not used. However, while such a touch panel has high visual quality, a manufacturing cost thereof tends to be higher than that of a touch panel having a bezel or a front case.

This disclosure describes examples to provide a touch panel which can be manufactured at low cost while ensuring high visual quality.

One aspect of the present disclosure is a touch panel, comprising: a first electrode substrate having a first conductive film; a second electrode substrate having a decorative portion facing the first conductive film; and a case configured to contain the first electrode substrate, wherein the first electrode substrate has a larger area than the second electrode substrate, and wherein the case is configured to cover an outer peripheral portion of the first electrode substrate outside the second electrode substrate, and not to cover the second electrode substrate.

Another aspect of the present disclosure is a touch panel, comprising: a first electrode substrate having a first conductive film; a second electrode substrate having a decorative portion facing the first conductive film; and a case configured to contain the first electrode substrate, wherein an outer dimension of the decorative portion is larger than an outer dimension of the second electrode substrate, and wherein the case has an eave configured to cover an outer peripheral portion of the second electrode substrate outside the decorative portion.

Still another aspect of the present disclosure is a touch panel, comprising: a first electrode substrate having a first conductive film; a second electrode substrate having a decorative portion facing the first conductive film; and a case configured to contain the first electrode substrate, wherein an outer dimension of the decorative portion matches an outer dimension of the second electrode substrate, and wherein the case has an eave configured to cover a part of the decorative portion.

DESCRIPTION OF EMBODIMENTS

Figure 1:
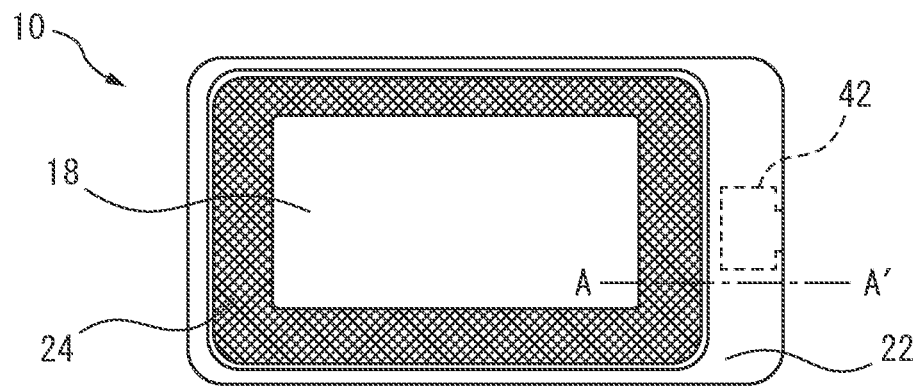
FIG. 1 is a top view of a touch panel according to a first embodiment.

Hereinafter, embodiments of the present disclosure will be described with reference to the attached drawings. In the following embodiments, the same or similar components may be indicated by a common reference numeral, and the description thereof may be omitted. These drawings have been scaled accordingly for ease of understanding.

Figure 2:
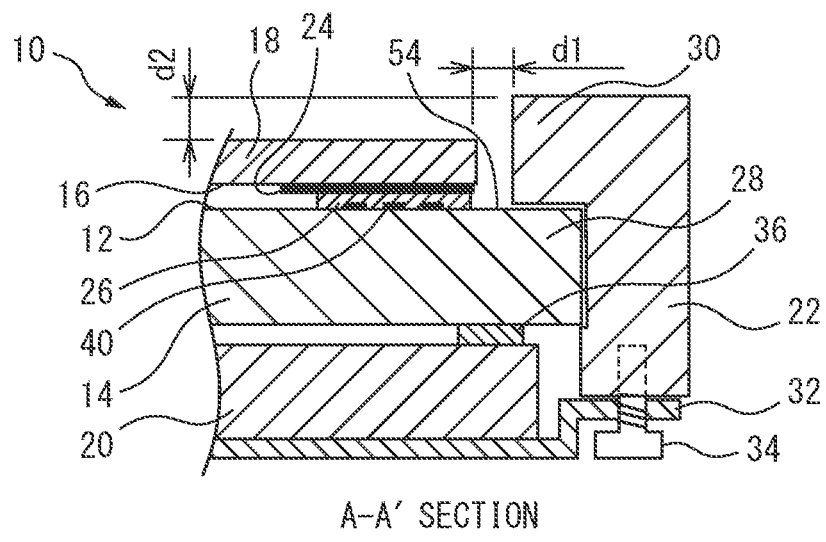
FIG. 2 is a cross-sectional view along an A-A' line of FIG. 1.

FIG. 1 is a schematic top view of a touch panel 10 according to a first embodiment, and FIG. 2 shows a cross-section along an A-A' line of FIG. 1. The touch panel 10 has a first electrode substrate (hereinafter referred to as "first substrate") 14 having an ITO (Indium Tin Oxide) 12 (first conductive film), a second electrode substrate (hereinafter referred to as "second substrate") 18 having an ITO (second conductive film) 16 facing the ITO 12, an indicator 20 such as an LCD or an organic EL panel arranged on a side of the first substrate 14 which does not face the second substrate 18, and a case 22 for containing the first substrate 14 and the indicator 20. In this embodiment, the first substrate 14 is a glass substrate and the second substrate 18 is a resin film substrate. The case 22 is integrally formed by injection molding of resin, etc., and has a substantially L-shape in a cross-sectional side view.

The second substrate 18 has a conductive decorative portion 24. The decorative portion 24 is formed in a frame shape as a design print. The outer dimension of the decorative portion 24 substantially matches the outer dimension of the second substrate 18. The decorative portion 24 is adhered to the first substrate 14 by an adhesive layer 26 such as a double-sided adhesive tape. In order to improve visual quality, an inner circumference of the decorative portion 24 is smaller than an inner circumference of the adhesive layer 26 so that the adhesive layer 26 does not protrude from the decorative portion 24.

Figure 3:
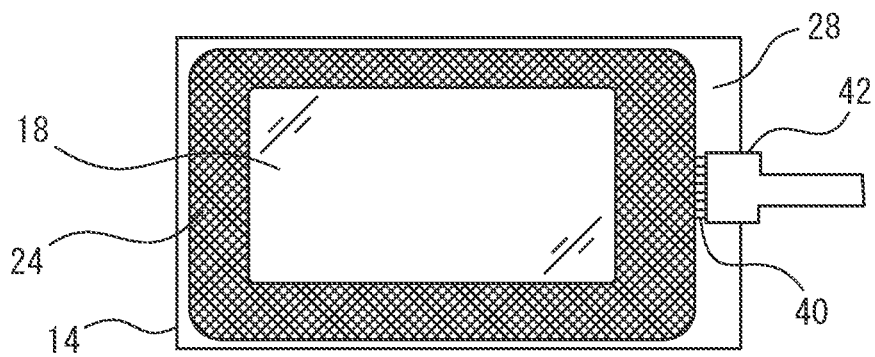
FIG. 3 is a view showing an assembly of two electrode substrates of the touch panel of FIG. 1.

As shown in FIGS. 2 and 3, the first substrate 14 has a larger area than the second substrate 18, and a shape and dimension of the first electrode 14 are determined so that the second substrate 18 is included in the first substrate 14 in a plan view. The case 22 has an eave or overhang portion 30 configured to covers an outer peripheral portion 28 of the first substrate 14 which is larger than the second substrate 18 and to not cover the second substrate 18. By virtue of the eave 30, a portion of the surface of the first substrate 14, which is not covered by the second substrate 18, is almost invisible from the outside. A flexible printed circuit board (FPC) 42 is attached to the outer peripheral portion 28 by crimping, etc., and the FPC 42 is electrically connected to a wiring 40 on the glass side. The FPC 42 is arranged outside the decorative portion 24.

Figure 4:
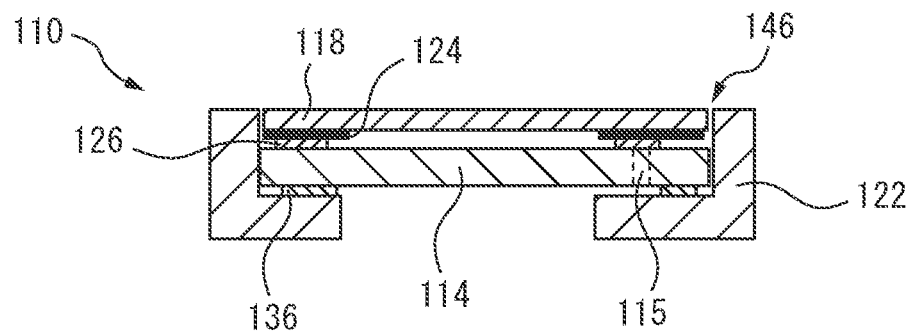
FIG. 4 is a cross-sectional view of a touch panel according to a comparative example.

FIG. 4 shows a side cross section of a touch panel 110 according to a comparative example. The touch panel 110 is a type which does not have a so-called bezel or front case, wherein a first substrate 114 and a second substrate 118 have substantially the same outer dimensions, and the substrates are adhered to each other with a double-sided adhesive tape 126, etc. The outer dimension of a decorative portion 124 formed on the second substrate 118 by printing, etc., are substantially equal to the outer dimension of the second substrate 18. Further, an inner dimension of a case 122 and an outer dimension of the first substrate 114 are almost the same, and the case 122 and the first substrate 114 are adhered to each other with a double-sided adhesive tape 136, etc.

In the touch panel 110, the first substrate 114 is fixed in the case 122 by dropping it into the case 122 from above. Therefore, when corner portions of the case 122 are subjected to R processing as in the case 22 of FIG. 1, corners of the first substrate 114 and corners of the second substrate 118 also need to be R-processed. Such processing increases the manufacturing cost, especially when the first substrate 114 is made of glass.

Further, since the outer dimension of the second substrate 118 and the inner dimension of the case 122 are not exactly the same, a certain clearance needs to be provided between the second substrate 1118 and the case 122. In that case, it is difficult to position and fix the first substrate 114 to the case 122 so that clearances between the second substrate 118 and the case 122 at all four sides of the touch panel 110 are uniform.

On the other hand, in the first embodiment, since the first substrate 14 is formed larger than the second substrate 18, and the eave 30 covering the outer peripheral portion 28 of the first substrate 14 is provided to the case 22. Therefore, it is not necessary to perform R processing on the corner portion of the first substrate 14, and the corner portion of the first substrate 14 may have a right-angled structure having no roundness, whereby the manufacturing cost of the touch panel 10 can be reduced. Further, as shown in FIG. 2, by abutting the edge of the first substrate 14 against the inner side surface of the case 22 when assembling the touch panel 10, the positioning of the first substrate 14 relative to the case 22 becomes easy.

For supporting and fixing the first substrate 14, for example, as shown in FIG. 2, a base material 32, such as a sheet metal which supports a lower surface of the indicator 20, is attached to a lower surface of the case 22 by using a fastening means such as a screw 34. In order to prevent the impact received by one of the first substrate 14 and the indicator 20 from propagating to the other, it is preferable that an adhesive layer 36, such as a double-sided adhesive tape having a certain thickness or more and cushioning property, be arranged between the first substrate 14 and the indicator 20.

In the touch panel 10, from the viewpoint of design, a gap d1 between the second substrate 18 and the eave 30 is preferably 2 mm or less, more preferably 1 mm or less, and further preferably 0.5 mm or less. A step d2, i.e., a difference between the eave 30 and an upper surface of the second substrate 18 serving as an operation surface of the touch panel in a height direction perpendicular to the operation surface, is preferably 2 mm or less, more preferably 1 mm or less, further preferably 0.5 mm or less, from the viewpoint of design and operability. In this embodiment, since the shape of the upper opening of the case 22 defined by the eave 30 is substantially the same as the outer shape of the decorative portion 24, the outer peripheral portion 28 and the FPC 42 of the first substrate 14 are not visible to the operator. Further, the eave 30 and the operation surface of the upper part of the second substrate 18 are substantially flush with each other, whereby a touch panel having excellent design is provided.

Figure 5:
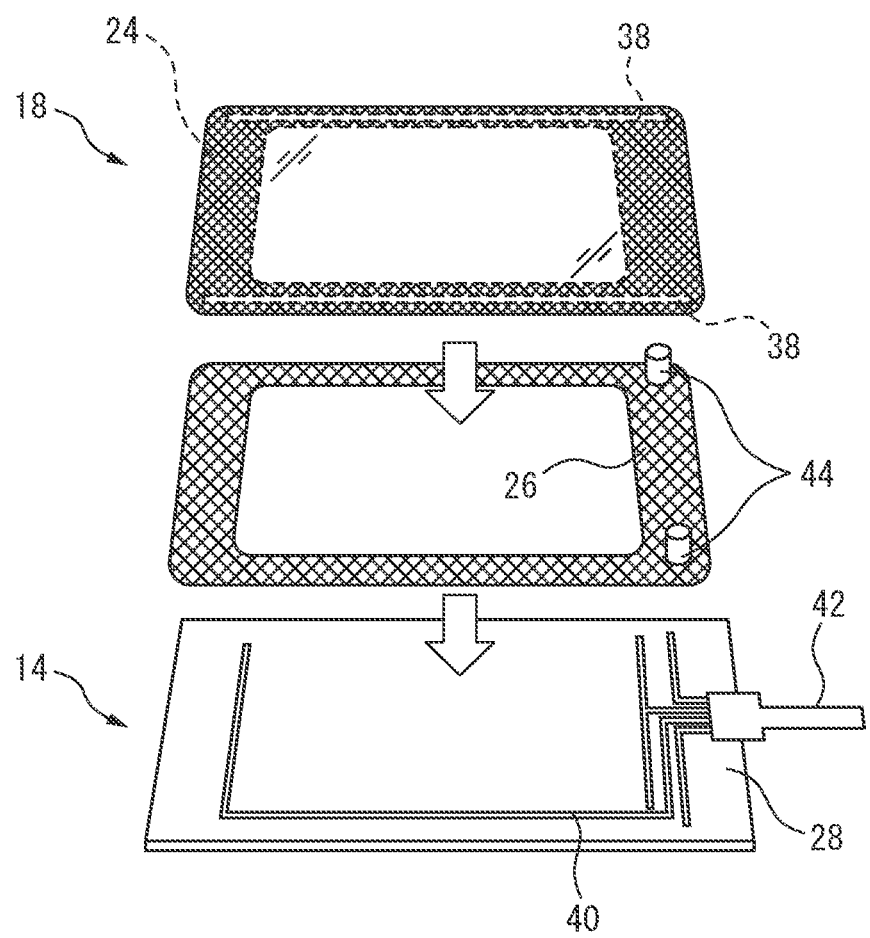
FIG. 5 is an exploded view of the assembly of FIG. 3.

FIG. 5 is an exploded view of the assembly of the first substrate 14 and the second substrate 18. In the first embodiment, the outer shape of the second substrate 18 substantially matches the outer shape of the decorative portion 24. The silver wiring, etc., which may affect the visual quality of the touch panel is preferably formed in the area covered by the decorative portion 24. The frame-shaped decorative portion 24 is formed by printing a conductive material such as conductive carbon on the lower surface of the second substrate 18 on which the ITO has been formed, and then a film side wiring 38 such as silver is formed on the lower surface of the decorative portion 24 by printing, etc. On the other hand, a wiring 40 such as silver, etc., is formed by printing, etc., on the upper surface of the first substrate 14 on which the ITO has been formed. By arranging the FPC 42 outside the decorative portion 24, it is not necessary to form a through hole for passing the FPC 42 through the first substrate 14. When the through hole was not formed in the first substrate, it was necessary to make the second substrate larger than the first substrate in order to prevent the FPC from being visible from the outside and to secure a space for passing the FPC, and thus there was a problem such as bending of the second substrate. However, such a problem does not occur in this embodiment.

Next, the first substrate 14 and the second substrate 18 are adhered to each other by using the adhesive layer 26 having a shape (in the drawing, a frame shape) included in the downward projection region of the decorative portion 24. In this regard, a hole is formed in a part of the adhesive layer 26, and then a conductive adhesive 44 is arranged in the hole so that the wirings 38 and 40 are conductively connected. In this way, the assembly of the first substrate 14 and the second substrate 18 shown in FIG. 3 can be manufactured.

Figure 6:
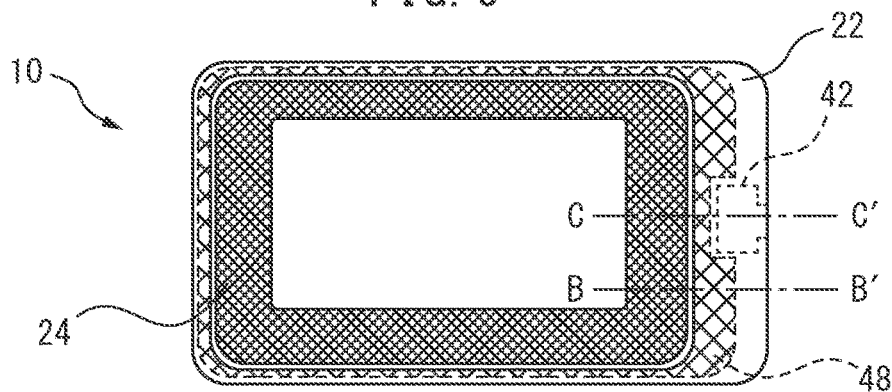
FIG. 6 is a top view of the touch panel of FIG. 1 to which a waterproof structure is provided.

FIG. 6 shows an example in which the touch panel 10 is provided with a waterproof structure. In FIG. 4, a gap 146 between the case 122 and the second substrate 118 is filled with a waterproofing agent in order to avoid adverse effects such as malfunction due to water entering through the gap 146. However, when a not shown FPC is arranged outside the touch panel 110, a sufficient waterproof effect cannot be obtained. Therefore, it is necessary to form a through hole 115 for passing the FPC through the first glass substrate 114, which may increases the cost.

Figure 7:
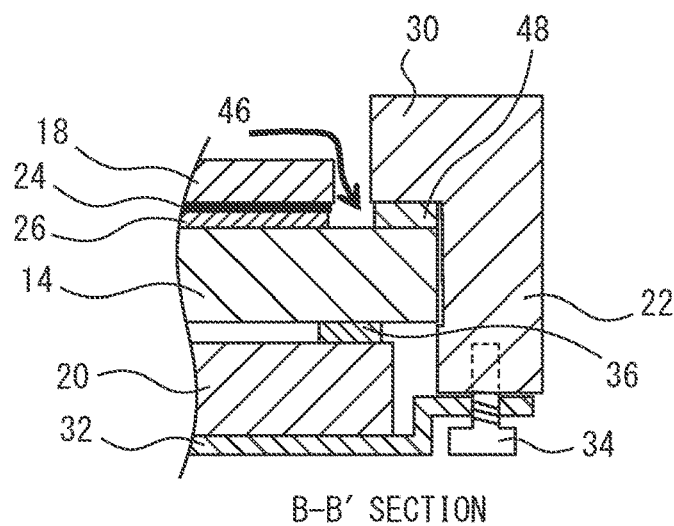
FIG. 7 is a cross-sectional view along a B-B' line of FIG. 6.
Figure 8:
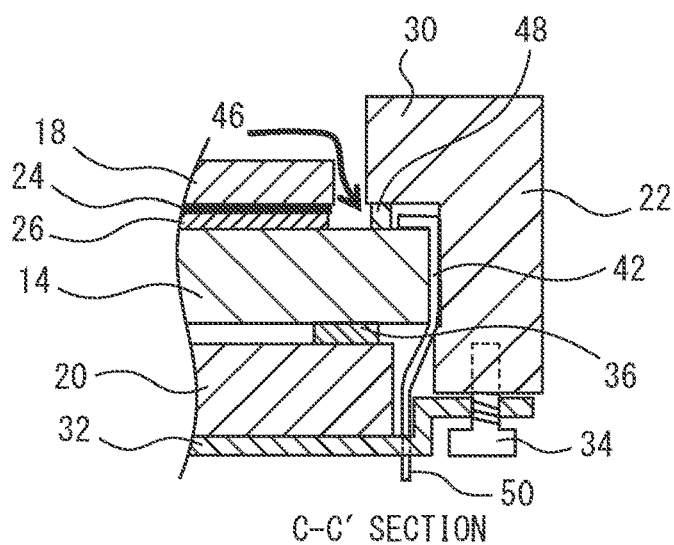
FIG. 8 is a cross-sectional view along a C-C' line of FIG. 6.

In the touch panel 10 shown in FIGS. 7 and 8, in order to prevent moisture, dust, etc. from entering through a gap 46 between the eave 30 and the second substrate 18, a frame-shaped adhesive layer 48 such as a double-sided adhesive tape having waterproof properties is arranged between the lower surface of the eave 30 and the outer peripheral surface of the first substrate 14. By virtue of this, it is possible to prevent moisture from entering the inside through the gap between the touch panel 10 and the case 22. If a commercially available adhesive tape having waterproof properties is used, the manufacturing cost of the touch panel 10 can be reduced.

As shown in FIG. 8, by using the adhesive layer 48 having a thickness equal to or larger than the thickness of the FPC 42, a space for crimping the FPC 42 can be obtained on the first substrate 14. Further, the FPC 42 may be bent and arranged so as to extend downward along the end portion of the first substrate 14, and a lower end 50 of the FPC 42 may be connected to a not shown substrate, etc. By virtue of this, whereby the first substrate 14 can be incorporated into the case 22 without forming a through hole in the glass substrate unlike FIG. 4, while ensuring waterproofness.

Figure 9:
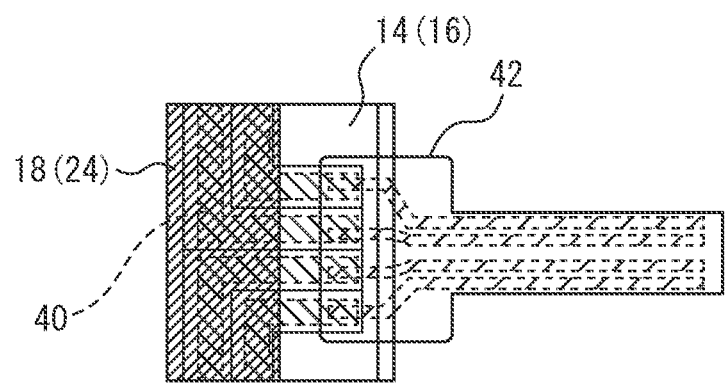
FIG. 9 is a partially enlarged view of a connection state between a first electrode substrate and an FPC.
Figure 10:
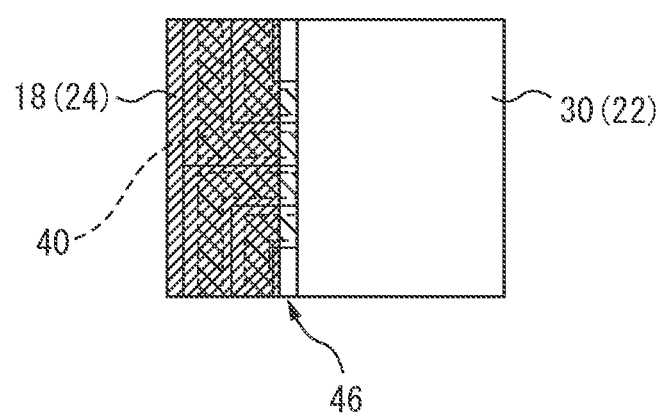
FIG. 10 is a partially enlarged view showing a state in which a case is arranged on an upper part of the structure of FIG. 9.

FIGS. 9 to 12 are views for explaining means for improving the appearance of the touch panel with respect to the gap 46 between the eave 30 and the second substrate 18. As shown in FIG. 9, when the wiring 40 printed on the first substrate 14 is connected to the FPC 42, the colored silver wiring 40 can be visually recognized from the gap 46 as shown in FIG. 10, and thus the visual quality of the touch panel may be deteriorated.

Figure 11:
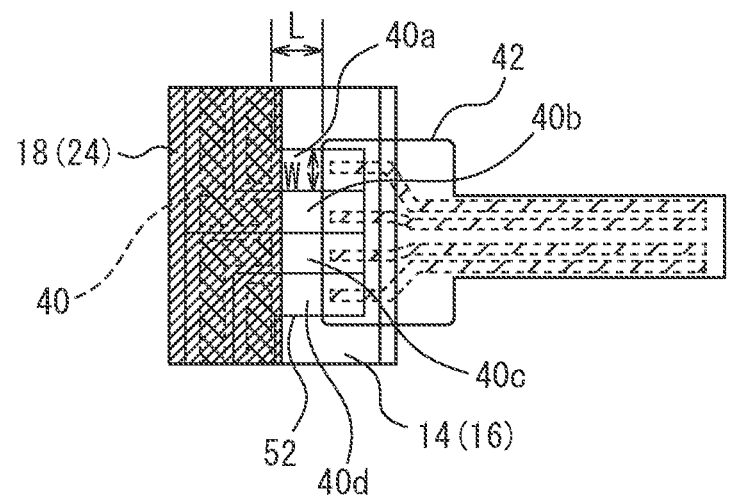
FIG. 11 is a partially enlarged view showing a state in which a silver wiring on the first electrode substrate is removed.
Figure 12:
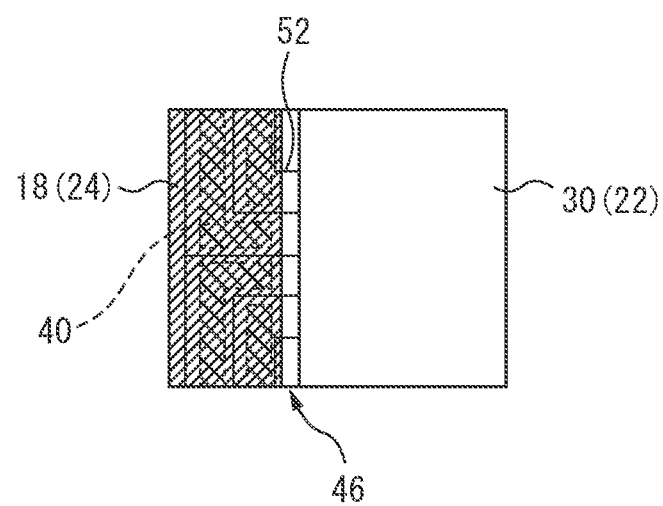
FIG. 12 is partially enlarged view showing a state in which a case is arranged on an upper part of the structure of FIG. 11.

Therefore, as shown in FIG. 11, the visual quality of the touch panel can be improved by not printing or forming the wiring 40 in the portion visible from the gap 46. In this case, the wiring 40 on the lower surface of the decorative portion 24 and the FPC are connected by the transparent ITO 16 formed on the first substrate 14. In FIG. 11, since the wiring 40 and the FPC are electrically connected by four wiring portions 40a to 40d, a part of the ITO 16 is linearly removed by etching, etc., so as to form a dividing line 52, so that the wiring portions do not conduct with each other. In this way, as shown in FIG. 12, the wiring 40 cannot be seen from the gap 46, and a good-looking touch panel can be configured.

Generally, an ITO has a higher electrical resistance than silver, etc., so it is preferable that a length L of the portion of the ITO 16 connecting the wiring 40 and the FPC 42 shown in FIG. 11 be as short as possible, and a width W of the portion be as long as possible. Specifically, it is preferable that L be 1 mm or less, and W be 1 mm or more.

Figure 13:
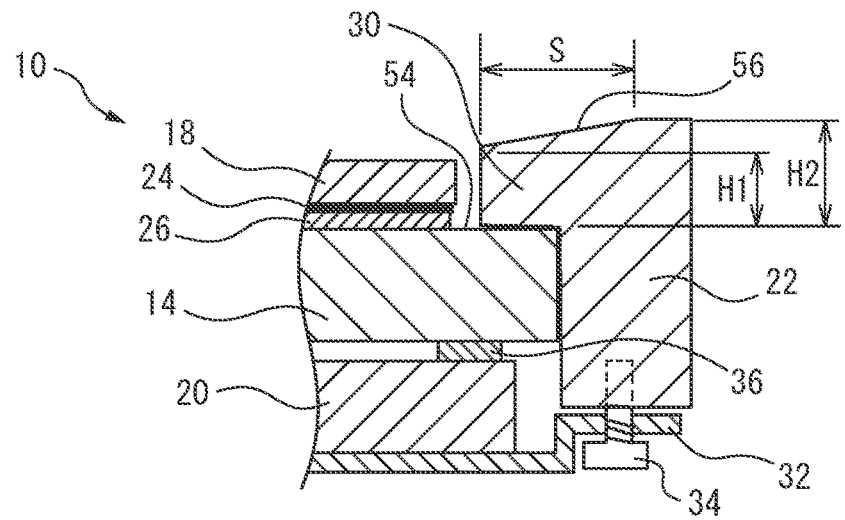
FIG. 13 is a cross-sectional view of a modification of FIG. 2.

Instead of or in addition to the removal of the wiring 40 shown in FIG. 11, an insulating layer 54 having the same color as the decorative printing 24 may be formed by printing a light-shielding insulating ink, etc., on a surface of the wiring 40 or the ITO 12 which can be visually recognized from the gap 46, as shown in FIG. 13. In this way, the wiring 40 below the insulating layer 54 is invisible from the gap 46, and the visual quality of the touch panel can be improved.

Whether or not the insulating layer 54 is the "same color" as the decorative portion 24 can be determined by, for example, an index value ΔE indicating a color difference defined by the International Commission on Illumination (CIE). When ΔE is 0.6 or less, the color difference is almost invisible to the naked eye. Therefore, it is preferable that ΔE between the insulating layer 54 and the decorative portion 24 be 0.6 or less.

FIG. 13 is a side sectional view of the touch panel 10 similar to FIG. 2. FIG. 13 shows a structure which further reduces the step (corresponding to d2 in FIG. 2) between the upper surface of the second substrate 18 and the eave 30. By forming the upper surface of the eave 30 as an inclined surface 56 whose height becomes lower toward the second substrate 18, the step between the upper surface of the second substrate 18 and the eave 30 can be smaller than in FIG. 2, while ensuring the rigidity and strength of the case 22. A horizontal length S, a minimum height H1 and a maximum height H2 of the inclined surface 56 are preferably determined in consideration of both the design of the touch panel and the strength of the case 22. For example, it is preferable that S be 2 mm or more to improve the visual quality, H1 be 0.5 mm or more to allow the eave 30 to have generally the same height as the thickness of the second substrate 18, and H2 be 1 mm or more to ensure the strength of the case 22.

Figure 14:
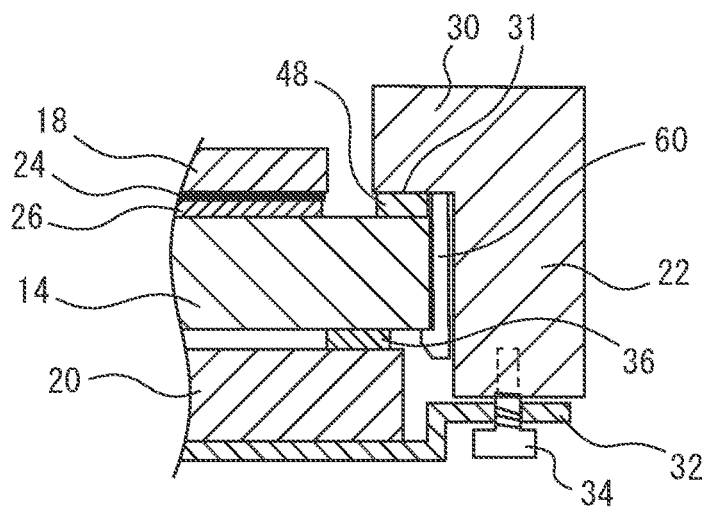
FIG. 14 is a view showing an example of a means for fixing the first electrode substrate to the case.

FIG. 14 shows a concrete example of a structure which facilitates mounting of the touch panel, more specifically, attaching of the case 22 to the first substrate 14. A snap-fit type engaging portion 60 extending downward may be arranged inside the case 22 such as the lower surface of the eave 30, and the lower end of the first substrate 14 may be engaged by the engaging portion 60 while the upper end of the first substrate 14 is pressed against an inner side surface 31 of the case 22. In this way, the first substrate 14 can be easily positioned and fixed with high accuracy relative to the case 22.

In this regard, similarly to FIGS. 6 to 8, the frame-shaped adhesive layer 48 having waterproofness may be arranged between the lower surface of the eave 30 and the outer peripheral surface of the first substrate 14, in order to prevent moisture from entering through the gap between the first substrate 14 and the case 22. Further, similarly to FIG. 2, the base material 32 configured to support the lower surface of the indicator 20 may be attached to the lower surface of the case 22 by using the screw 34, etc. Moreover, the adhesive layer 36 having the certain thickness or more and cushioning property may be arranged between the first substrate 14 and the indicator 20.

Figure 15:
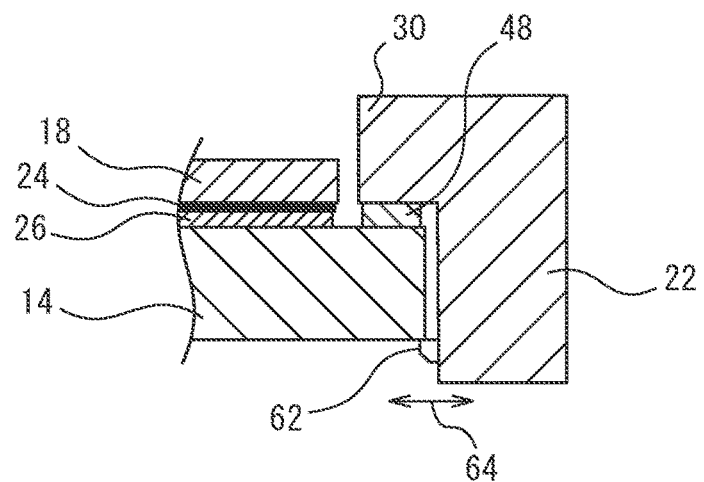
FIG. 15 is a view showing another example of a means for fixing the first electrode substrate to the case.

FIG. 15 shows an alternative example of FIG. 14, in which a protrusion 62 for fitting the first substrate 14 is arranged on the inner surface of the case 22. By sandwiching the first substrate 14 between the lower surface of the eave 30 and the protrusion 62, the first substrate 14 can be positioned with high accuracy and reliably fixed to the case 22. In this regard, the protrusion 62 can be elastically displaced in the direction of an arrow 64 so as to come into contact with and separated from the first substrate 14, by a not shown elastic means such as a spring contained in the case 22. The protrusion 62 is configured to engage the lower end of the first substrate 14 when it is displaced toward the first substrate 14. In this way, the touch panel can be mounted more easily.

Also in FIG. 15, similarly to FIGS. 6 to 8, the adhesive layer 48 may be arranged between the lower surface of the eave 30 and the outer peripheral surface of the first substrate 14, in order to prevent moisture from entering the gap between the first substrate 14 and the case 22. Further, similarly to FIG. 14, the means such as the base material 32, the screw 34 and the adhesive layer 36 for fixing the indicator 20 to the case 22 may be applied to FIG. 15.

Figure 16:
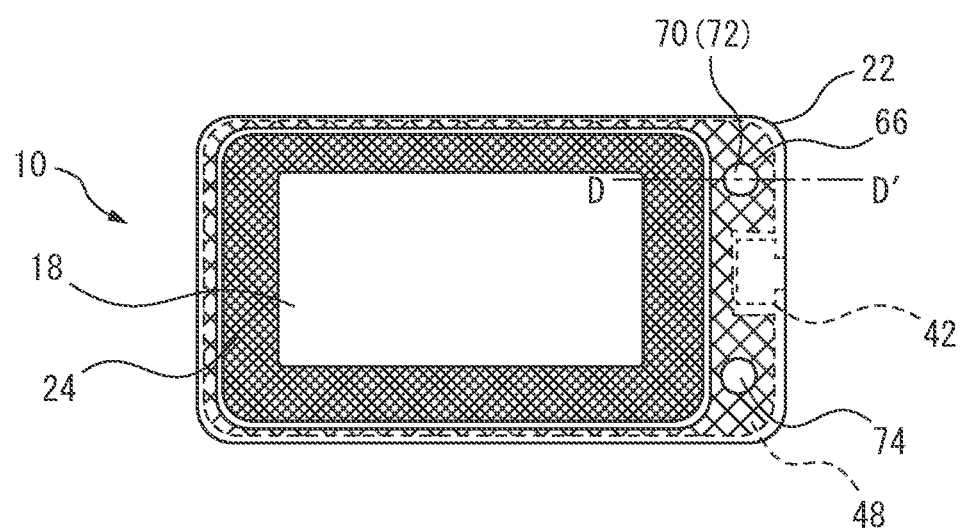
FIG. 16 is a top view of the touch panel to which a mechanical switch is provided.
Figure 17:
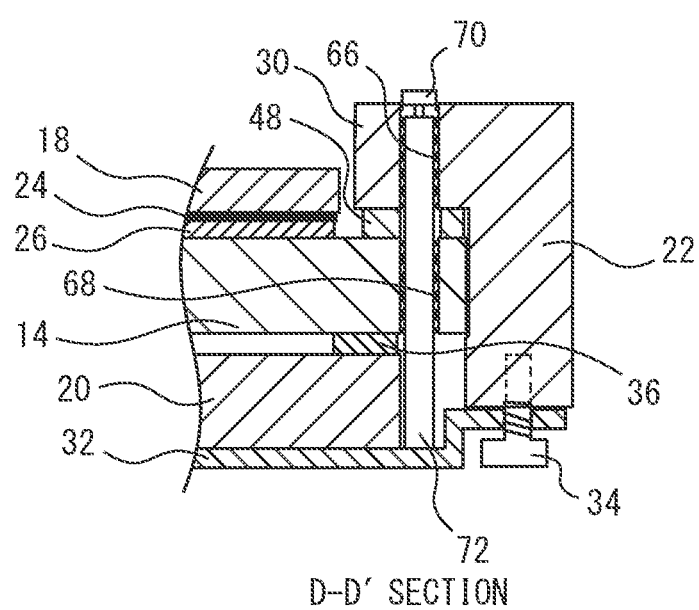
FIG. 17 is a cross-sectional view along a D-D' line of FIG. 16.

FIGS. 16 and 17 show an example for effectively utilizing the area of the case 22. As shown in FIGS. 16 and 17, a through hole 66 may be formed in the eave 30, a through hole 68 may be formed in the first substrate 14, and a switch 72 having a movable portion 70 such as a push button extending through the holes 66 and 68 may be arranged. In addition to or instead of the switch 72, a sensor 74 such as a camera may be arranged. In this way, it is possible to provide a touch panel capable of performing various operations and processes in addition to the operation on the touch surface, without substantially enlarging the case 22.

Figure 18:
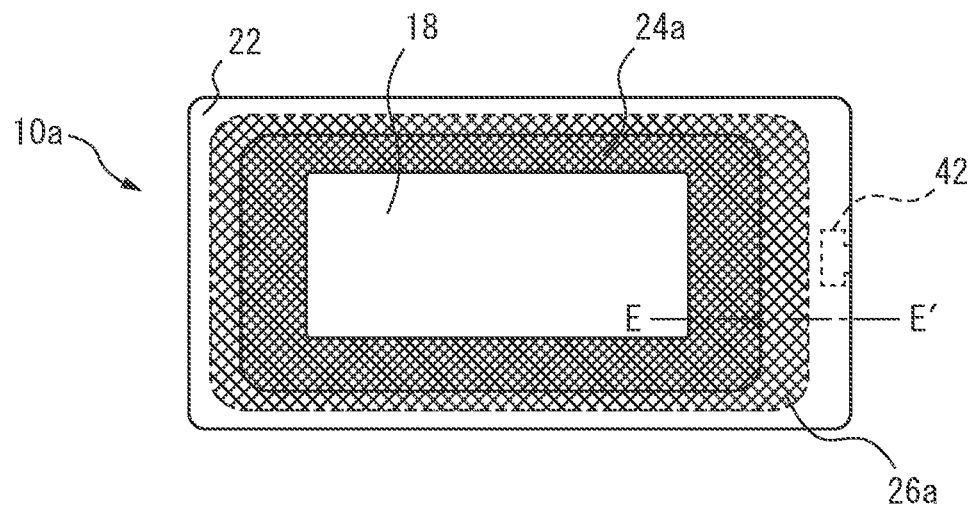
FIG. 18 is a top view of a touch panel according to a second embodiment.
Figure 19:
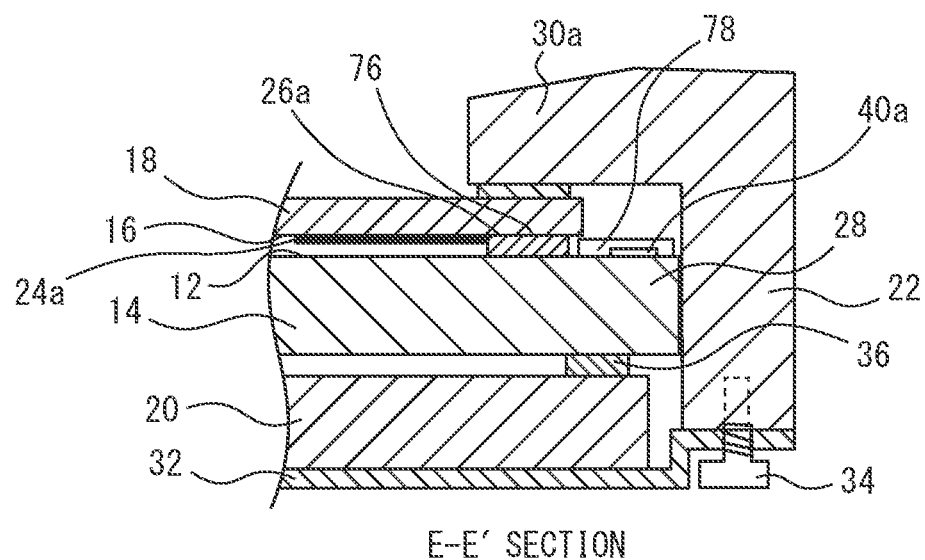
FIG. 19 is a cross-sectional view along an E-E' line of FIG. 18.

FIG. 18 shows a schematic top view of a touch panel 10a according to a second embodiment, and FIG. 19 shows a cross section along an E-E' line of FIG. 18. The touch panel 10a has the first substrate 14 having the ITO 12 (first conductive film), the second substrate 18 having the ITO 16 (second conductive film) facing the ITO 12, and the indicator 20 arranged on the side of the first substrate 14 which does not face the second substrate 18, and the case 22 for containing the first substrate 14 and the indicator 20. In this embodiment, the first substrate 14 is a glass substrate and the second substrate 18 is a resin film substrate. The case 22 is integrally formed by injection molding of resin, etc., and has a substantially L-shape in a cross-sectional side view.

The second substrate 18 has a decorative portion 24a. The decorative portion 24a is formed in a frame shape, for example, as a design print. The outer dimension of the decorative portion 24a does not match the outer dimension of the second substrate 18, unlike the first embodiment, and thus the decorative portion 24a is smaller than the second substrate 18. Further, a portion (outer peripheral portion) 76 of the second substrate 18 outside the decorative portion 24a is adhered to the first substrate 14 by an adhesive layer 26a such as a double-sided adhesive tape. As shown in FIG. 19, an insulating layer 78 is formed by printing, etc., on the wiring 40 formed on the outer peripheral portion 28 of the first substrate 14.

Figure 20:
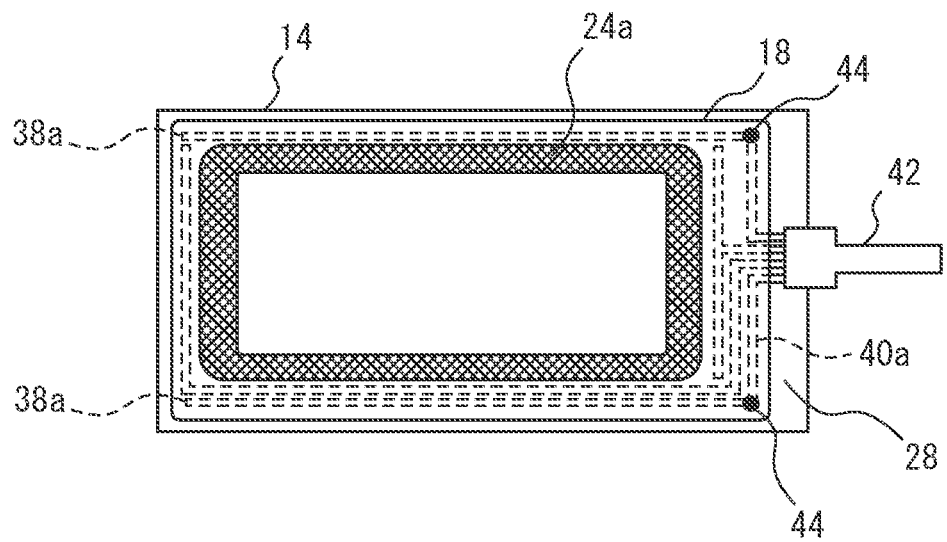
FIG. 20 is a view showing an assembly of two electrode substrates of the touch panel of FIG. 18.

As shown in FIGS. 19 and 20, the first substrate 14 has a larger area than the second substrate 18, has a shape and dimension including the second substrate 18 in a plan view, and has the outer peripheral portion 28 outside the second substrate 18. An eave 30a of the second embodiment is configured not only to cover the outer peripheral portion 28 as in the first embodiment, but also to cover the outer peripheral portion 76 of the second substrate 18. In the second embodiment, in addition to the outer peripheral portion 28 of the first substrate 14, the outer portion of the second substrate 18 on which the design printing 24a is not formed is also covered by the eave 30a. Therefore, the electrode substrate outside the design printing 24a is not visible to the operator, and the touch panel 10a with high visual quality can be obtained.

Although the decorative portion 24 in the first embodiment must have conductivity, in the second embodiment as shown in FIG. 20, both the wirings 38a and 40a are arranged outside the decorative portion 24a, and thus it is not necessary to form the decorative portion 24a with a conductive material, and an insulating ink, etc., can be used as the material of the decorative portion 24a. Since the insulating ink can be obtained in various colors as compared with the conductive material such as conductive carbon, the second embodiment can provide the touch panel 10a having a high design property with few restrictions on the color of the decorative portion.

Also in the second embodiment, it is not necessary to R-process the corner portion of the first glass substrate 14, and thus the manufacturing cost of the touch panel 10a can be reduced. Further, as shown in FIG. 19, by abutting the end portion of the first substrate 14 against the inner side surface of the case 22 in the assembly process of the touch panel 10a, the first substrate 14 can be easily positioned relative to the case 22.

As exemplified in FIG. 19, the first substrate 14 is supported and fixed by fixing the base material 32 configured to support the lower surface of the indicator 20 to the lower surface of the case 22 by using the screw 34, etc. The adhesive layer 36 having a certain thickness or more and cushioning property may be arranged between the first substrate 14 and the indicator 20.

Figure 21:
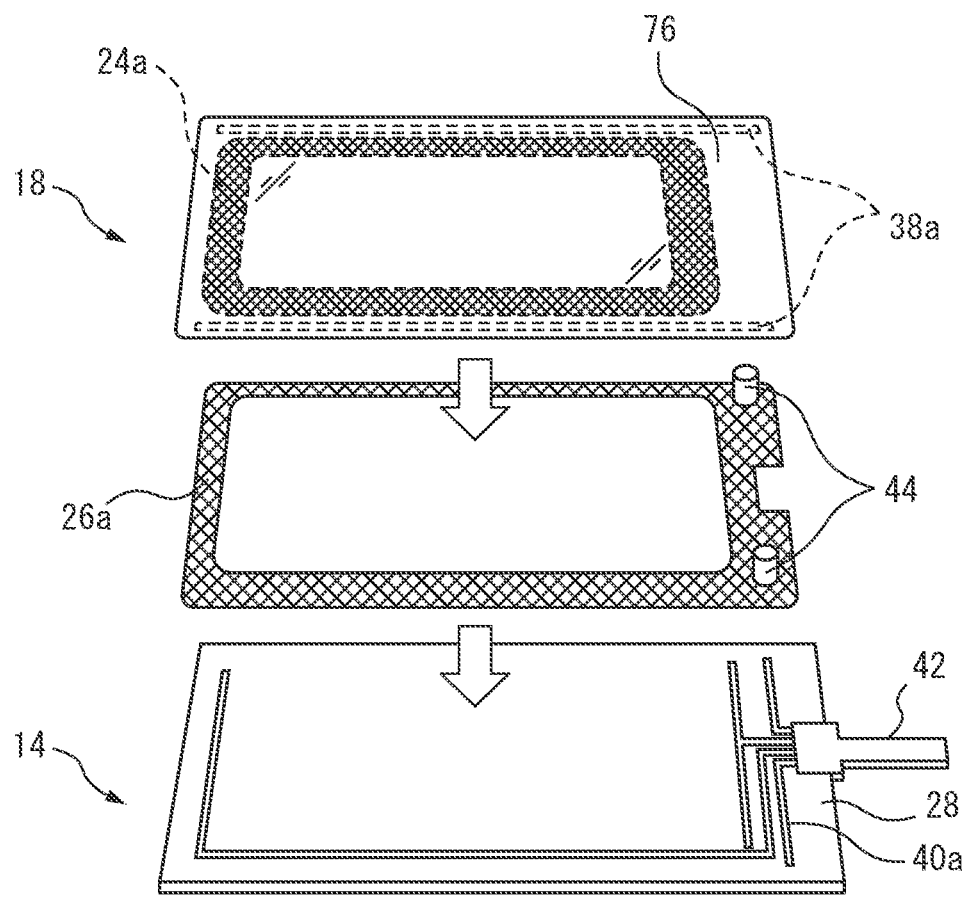
FIG. 21 is an exploded view of the assembly of FIG. 20.

FIG. 21 is an exploded view of the assembly of the first substrate 14 and the second substrate 18. The frame-shaped decorative portion 24a is formed by printing a conductive material on the lower surface of the second substrate 18 on which the ITO is formed, and a film side wiring 38a is formed by printing, etc., on the outer peripheral portion 76 of the second substrate 18 outside the decorative portion 24a. On the other hand, a wiring 40a made of silver, etc., is formed by printing, etc., on the upper surface of the first substrate 14 on which the ITO is formed, and the FPC 42 is connected to the wiring 40a.

Next, the first substrate 14 and the second substrate 18 are adhered to each other, by using the adhesive layer 26a having a shape (in the drawing, a frame-shape) included in the downward projection region of the outer peripheral portion 76. In this regard, a hole is formed in a part of the adhesive layer 26a, and then the conductive adhesive 44 is arranged in the hole so that the wiring 38a and the wiring 40a are conductively connected. In this way, the assembly of the first substrate 14 and the second substrate 18 shown in FIG. 20 can be manufactured.

Figure 22:
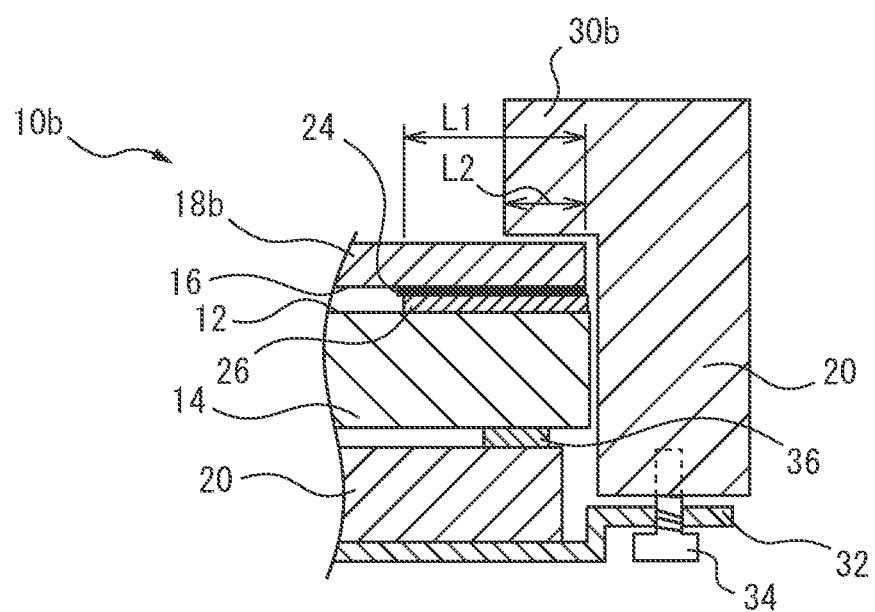
FIG. 22 is a sectional side view of a touch panel according to a third embodiment.

FIG. 22 shows a sectional side of a touch panel 10b according to a third embodiment. The touch panel 10b has the first substrate 14 having the ITO 12 (first conductive film), a second substrate 18b having the ITO 16 (second conductive film) facing the ITO 12, and the indicator 20 arranged on the side of the first substrate 14 which does not face the second substrate 18b, and the case 22 for containing the first substrate 14 and the indicator 20. In this embodiment, the first substrate 14 is a glass substrate and the second substrate 18b is a resin film substrate. The case 22 is integrally formed by injection molding of resin, etc., and has a substantially L-shape in a cross-sectional side view.

The second substrate 18b has the conductive decorative portion 24. The decorative portion 24 is formed in a frame shape as a design print. The outer dimension of the decorative portion 24 substantially matches the outer dimension of the second substrate 18b. At least a part of the decorative portion 24 is adhered to the first substrate 14 by the adhesive layer 26 such as a double-sided adhesive tape.

Unlike the first and second embodiments, the second substrate 18b has substantially the same outer dimension as the first substrate 14, and the outer dimension of the decorative portion 24 are substantially the same as the outer dimension of the second substrate 18b. On the other hand, an eave 30b is configured to partially cover the decorative portion 24. When a width L1 of the decoration portion 24 is 10 to 30 mm, the eave 30b is configured to cover the decoration portion 24 by a distance L2 shorter than a distance L1 from the outer circumference of the decoration portion 24. The L2 is, for example, 2 to 5 mm. In this way, since there is no gap between the second substrate 18b and the eave 30b when viewed from above, the visual quality of the touch panel is not deteriorated, and the touch panel can be easily incorporated into the case 22. Further, by overlapping the decorative portion 24 and the adhesive layer 26, the adhesive layer 26 can be invisible even if the eave 30b is provided outside the inner circumference of the adhesive layer 26, whereby the visual quality of the touch panel is not deteriorated. Even if the eave 30b is pressed against the touch panel by the palm, etc., it is possible to prevent erroneous input on the touch panel.

Also in the third embodiment, it is not necessary to R-process the corner portion of the first glass substrate 14, and the manufacturing cost of the touch panel 10b can be reduced. As shown in FIG. 22, by abutting the end portion of the first substrate 14 against the inner side surface of the case 22 when assembling the touch panel 10a, the positioning of the first substrate 14 relative to the case 22 becomes easy.

For supporting and fixing the first substrate 14, for example, as shown in FIG. 22, the base material 32 configured to support the lower surface of the indicator 20 is fixed to the lower surface of the case 22 by using the screw 34, etc. The adhesive layer 36 having a certain thickness or more and cushioning property may be arranged between the first substrate 14 and the indicator 20.

The embodiments described above can be appropriately combined. For example, the touch panel 10a of the second embodiment or the touch panel 10b of the third embodiment may have at least one of: the snap-fit structure of FIG. 14 of the first embodiment or FIG. 15 of the second embodiment; the eave having the inclined surface of FIG. 13; and the mechanical switch or the sensor of FIG. 17.

Although the above embodiments have been described for the resistive touch panel, the present disclosure is not limited as such. The touch panel according to the present disclosure may be a capacitance type or an electrostatic coupling type. In the case of the resistive touch panel, for example, any of a 4-wire type, a 5-wire type, a 7-wire type, and an 8-wire type may be used. The silver wiring may be replaced with copper wiring, conductive polymer wiring or conductive carbon wiring, and the ITO may also be replaced with conductive polymer, etc.

Although the embodiments have been specifically described above, the present invention is not limited to the above-described embodiments. Various variations and modifications may be made without departing from the scope of the present invention.

The invention claimed is:

1. A touch panel, comprising:
a first electrode substrate having a first conductive film;
a second electrode substrate having a second conductive film facing the first conductive film and a decorative portion facing the first conductive film; and
a case configured to contain the first electrode substrate,
wherein the first electrode substrate has a larger area than the second electrode substrate,
wherein the case has an eave configured to cover an outer peripheral portion of the first electrode substrate outside the second electrode substrate, and not to cover the second electrode substrate, and
wherein the touch panel further comprises a switch or sensor extending and positioned in through holes formed in the eave and the first electrode substrate.

2. The touch panel according to claim 1, further comprising a double-sided adhesive layer configured to adhere the eave to the first electrode substrate,
wherein the adhesive layer has a thickness equal to or greater than a thickness of a flexible printed circuit board attached to the first electrode substrate, and the flexible printed circuit board is configured to extend downward along an end portion of the first electrode substrate.

3. The touch panel according to claim 1, wherein the case has a snap-fit type engaging portion configured to be engaged with a lower end of the first electrode substrate.

4. The touch panel according to claim 1, wherein the case has a protrusion configured to be elastically displaced in a direction so as to come into contact with and separated from the first electrode substrate, and to be engaged with a lower end of the first electrode substrate.

5. A touch panel, comprising:
a first electrode substrate having a first conductive film;
a second electrode substrate having a decorative portion facing the first conductive film; and
a case configured to contain the first electrode substrate,
wherein an outer dimension of the decorative portion is larger than an outer dimension of the second electrode substrate, and
wherein the case has an eave configured to cover an outer peripheral portion of the second electrode substrate outside the decorative portion.

6. A touch panel, comprising:
a first electrode substrate having a first conductive film;
a second electrode substrate having a decorative portion facing the first conductive film; and
a case configured to contain the first electrode substrate,
wherein an outer dimension of the decorative portion matches an outer dimension of the second electrode substrate, and
wherein the case has an eave configured to cover a part of the decorative portion.

7. The touch panel according to claim 1, further comprising an adhesive layer configured to adhere the decorative portion to the first electrode substrate.

8. The touch panel according to claim 1, further comprising:
a wiring formed on a surface of the first electrode substrate; and
a printed circuit board connected to the wiring at a portion of the first electrode substrate outside the decorative portion.

* * * * *